US008816390B2

(12) United States Patent
Marbella et al.

(10) Patent No.: US 8,816,390 B2
(45) Date of Patent: Aug. 26, 2014

(54) SYSTEM AND METHOD FOR AN ELECTRONIC PACKAGE WITH A FAIL-OPEN MECHANISM

(75) Inventors: Carlo Baterna Marbella, Singapore (SG); Ganesh Vetrivel Periasamy, Singapore (SG); Kok Kiat Koo, Singapore (SG); Ai Min Tan, Singapore (SG)

(73) Assignee: Infineon Technologies AG, Neubiberg (DE)

( * ) Notice: Subject to any disclaimer, the term of this patent is extended or adjusted under 35 U.S.C. 154(b) by 236 days.

(21) Appl. No.: 13/361,742

(22) Filed: Jan. 30, 2012

(65) Prior Publication Data

US 2013/0194752 A1    Aug. 1, 2013

(51) Int. Cl.
*H05K 7/20* (2006.01)
*H01L 21/52* (2006.01)
*H01L 23/373* (2006.01)

(52) U.S. Cl.
USPC ............ 257/173; 257/355; 257/762; 361/719

(58) Field of Classification Search
USPC .......................... 257/173, 355, E23.11, E21.5
See application file for complete search history.

(56) References Cited

U.S. PATENT DOCUMENTS

| | | | |
|---|---|---|---|
| 4,635,091 A | 1/1987 | Roger | |
| 6,255,141 B1 | 7/2001 | Singh et al. | |
| 2002/0016022 A1* | 2/2002 | Shintani | 438/108 |
| 2008/0180871 A1* | 7/2008 | Hebert et al. | 361/106 |
| 2010/0245022 A1 | 9/2010 | Galla et al. | |
| 2011/0121705 A1* | 5/2011 | Bancken et al. | 313/46 |

OTHER PUBLICATIONS

Graf, et al., "Infineon: Hot Body," Abschlussbericht des Fraunhofer IZM Berlin, "Sicherer Kfz-Body-Leistungshalbleiter," Infineon Technologies, AG, Berlin, Jan. 31, 2005. 44 pages.

* cited by examiner

*Primary Examiner* — Long K Tran
*Assistant Examiner* — Jordan Klein
(74) *Attorney, Agent, or Firm* — Slater & Matsil, L.L.P.

(57) ABSTRACT

In accordance with an embodiment, a semiconductor package includes a first surface configured to be mounted on a circuit board, and a region of thermally expandable material configured to push the first surface of the semiconductor package away from the circuit board when a temperature of the thermally expandable material exceeds a first temperature.

18 Claims, 14 Drawing Sheets

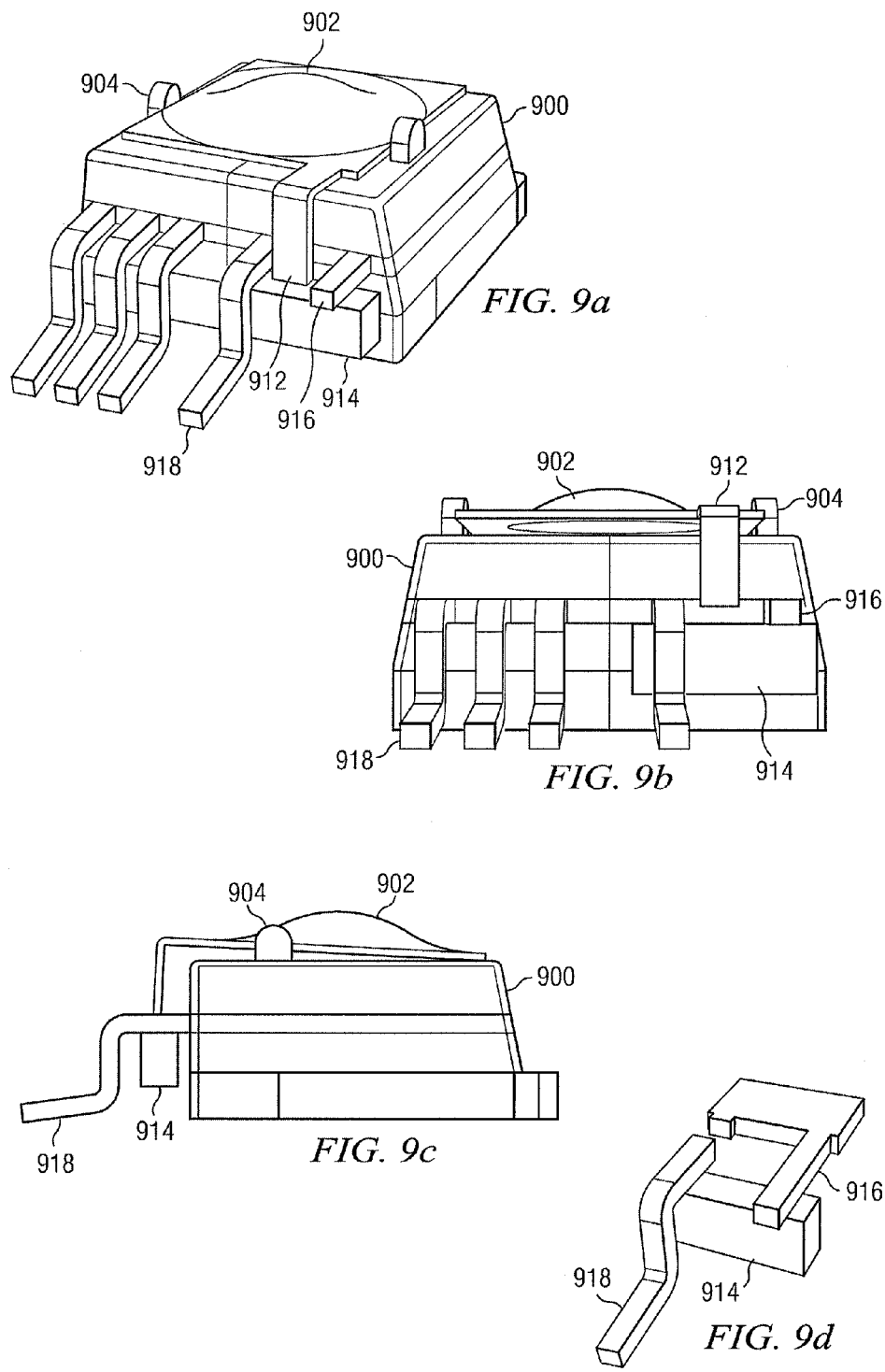

SYSTEM AND METHOD FOR AN ELECTRONIC PACKAGE WITH A FAIL-OPEN MECHANISM

TECHNICAL FIELD

An embodiment of the invention relates generally to electronic component packages, and more particularly to a system and method for an electronic package with a fail-open mechanism.

BACKGROUND

Power semiconductor devices such as power Metal-Oxide Semiconductor Field-Effect Transistor (MOSFET) devices have become ubiquitous in a wide range of applications, from industrial applications such as heavy machinery, to consumer applications such as Heating, Ventilation, & Air Conditioning (HVAC) systems, electrical distribution systems and automotive systems. Power semiconductor devices are useful in that they can replace mechanical switches and relays with a fully solid-state device having a small form factor. In some situations, however, power semiconductor devices may pose a safety hazard due to device failure. For example, a power MOSFET device may fail in a short-circuit condition due to dielectric breakdown or metallization shorts that results in a low ohmic state. In this low ohmic state, control over the gate of the MOSFET is lost for a prolonged duration resulting in localized resistive heating of the device, which may create a hot spot within the device. Over time, this heating may lead to an undesirable thermal ignition of the package of the MOSFET device, the printed circuit board (PCB) on which the device is mounted, and/or the system in which the device installed.

Thermal ignition of power semiconductor devices is particularly dangerous in systems in which safety is a primary concern, such as in an automobile. If localized heating in a power semiconductor causes thermal ignition, the package ignites, which, in turn, ignites the PCB on which the package is mounted. The burning PCB may then set the automobile on fire.

Detecting the onset of a thermal overload condition is challenging because the onset of thermal overload is not necessarily accompanied by an easily detectable high current condition. If local heating within a particular device is caused by current crowding in a small region of the devices semiconductor material, high temperatures may be achieved within the device without appreciable current. Controlling or stopping the thermal overload condition may also be difficult if the device fails in a short-circuit condition that leaves the device uncontrollable. Some systems, have addressed this issue by coupling reflowable a thermal protection device (RTP) in series with the gate of the power semiconductor device that is designed to create an open circuit when the temperature of the RTP device exceeds a critical temperature.

SUMMARY OF THE INVENTION

In accordance with an embodiment, a semiconductor package includes a first surface configured to be mounted on a circuit board, and a region of thermally expandable material configured to push the first surface of the semiconductor package away from the circuit board when a temperature of the thermally expandable material exceeds a first temperature The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

The details of one or more embodiments of the invention are set forth in the accompanying drawings and the description below. Other features, objects, and advantages of the invention will be apparent from the description and drawings, and from the claims. In the figures, identical reference symbols generally designate the same component parts throughout the various views, which will generally not be redescribed in the interest of brevity. For a more complete understanding of the invention, reference is now made to the following descriptions taken in conjunction with the accompanying drawings, in which:

FIGS. 9a-d illustrate a package according to a further embodiment; and

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to exemplary embodiments in a specific context, namely a system and method for an electronic package with a fail-open mechanism within a power semiconductor device. Embodiment systems and methods may also be applied to other types of electronic components that are prone to thermal overload.

Figure 1A:
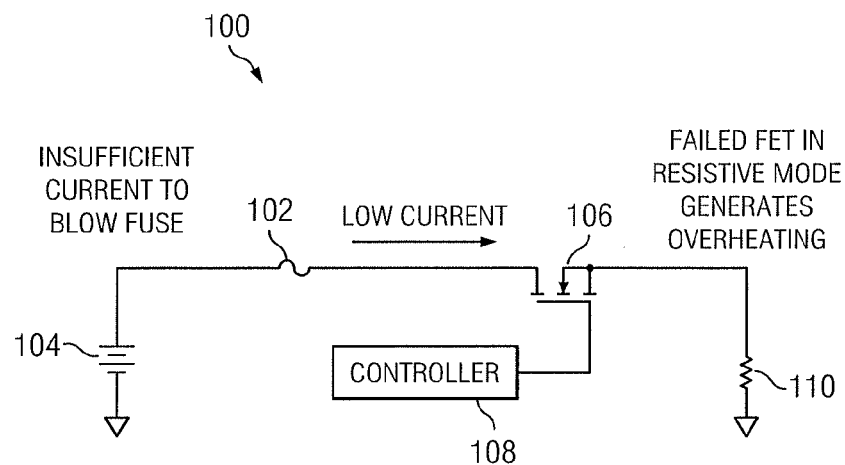
FIGS. 1a-1b illustrates example automotive battery switch systems.

FIG. 1a illustrates the issue of overheating in power semiconductor devices using automotive battery switch system 100 as an example. Automotive battery switch system 100 supplies power from battery 104 to load resistance 110 via fuse 102 and power transistor 106. Control integrated circuit 108 controls the gate of power transistor 106. Under normal operating conditions, control integrated circuit 108 may activate power transistor 106, once the ignition switch is activated by a driver. When power transistor 106 is turned on, current flows from battery 106 through load resistance 110. A typical automotive system may have a dozen or so power transistor switches that control the power to various systems of the automobile. For example, systems such as the wiper motor, interior lighting, the car's audio system, and other systems may each have a dedicated switch that supplies power to that particular system.

During normal operation, power transistor 106, which may be implemented as an n-channel MOSFET, has a low drain-source resistance. Power transistor 106 may operate under a wide range of voltages and frequencies, and may even have additional circuitry within the package of the power transistor that provides electrostatic discharge (ESD) protection and high temperature protection during normal operating conditions. However, in an end-of-life scenario for power transistor 106, dielectric breakdown or metallization shorts may occur, resulting in power transistor 106 being placed in a low ohmic state. In some situations, a source-drain short-circuit results, leaving power transistor 106 unable to be controlled via its gate terminal, resulting in resistive heating in a localized hotspot that may lead to thermal ignition of the package, the PCB, or the system in which the PCB and package are disposed.

Because heat is generated within localized hot spots within the device, thermal ignition of power transistor 106 may result in low current failure conditions. In other words, high temperatures may result from currents that are less than the trip point of fuse 102. If power transistor switch 106 fails in a low ohmic condition, a severe electrical overload may ignite the device.

In an embodiment of the present invention, thermal ignition is avoided by using a thermally expandable material, or a thermally deformable material to create an open circuit between terminals of a power transistor or other component and a circuit board as the result of a high thermal condition. For example, in one embodiment bimetal strip made of two dissimilar metals having a different coefficient to thermal expansion (CTE) is used to lift a package component at the source pins, which leads to an open circuit. In the low ohmic state, the chip heats the package and increases the temperature of the leads. When the solder material is in a molten state due to the increase in temperature, the bimetallic strip or other thermally deformable material underneath the package warps, and lifts the package above the circuit board, resulting in a de-soldered lead joint. In embodiments, the thermally deformable material warps at a particular temperature, preferably above the melt point of the solder. In one embodiment an open circuit is formed when the component reaches a temperature of its 260° C. Alternatively, other temperatures may be used depending on the particular embodiment and its specifications.

In an embodiment, a short circuit condition is terminated by physically displacing an integrated circuit (IC) package, for example a surface mounted IC package, from the printed circuit board in order to open an electrical path between the IC package and the printed circuit board. In some embodiments the displacement occurs at a temperature higher than the melting temperature of the solder that is used to solder the package to the printed circuit board. In some embodiments the solder melting temperature may be, for example, at or above 280° C. In some embodiments package displacement may be affected mechanically by use of a thermally sensitive material that changes its shape as a response to thermal influence. This thermally sensitive material may be a thermostat metal bimetal (or multi-level metal) spring. In some embodiments of the present invention this change in shape is affected by the types of materials used, the coefficient of thermal expansion of the materials used, and its geometry.

In some embodiments, the thermally sensitive material may be an integrated part of the circuit package, or a separate component that is attachable or detachable to the circuit package. The location of the thermally sensitive material may be located in a number of different positions. For example, the thermally sensitive material may be located on top of the circuit component, on the side of the circuit component, underneath the circuit package and/or any other location that may affect an intended physical displacement. In some embodiments of the present invention, the deformation of the thermally sensitive material is configured to be an irreversible action to prevent the thermally sensitive material from going back to its original position if the temperature reduces below the thermal triggering temperature. In some embodiments, a lock mechanism may be used and or springs in the component to prevent the device from assuming its original position.

Figure 1B:
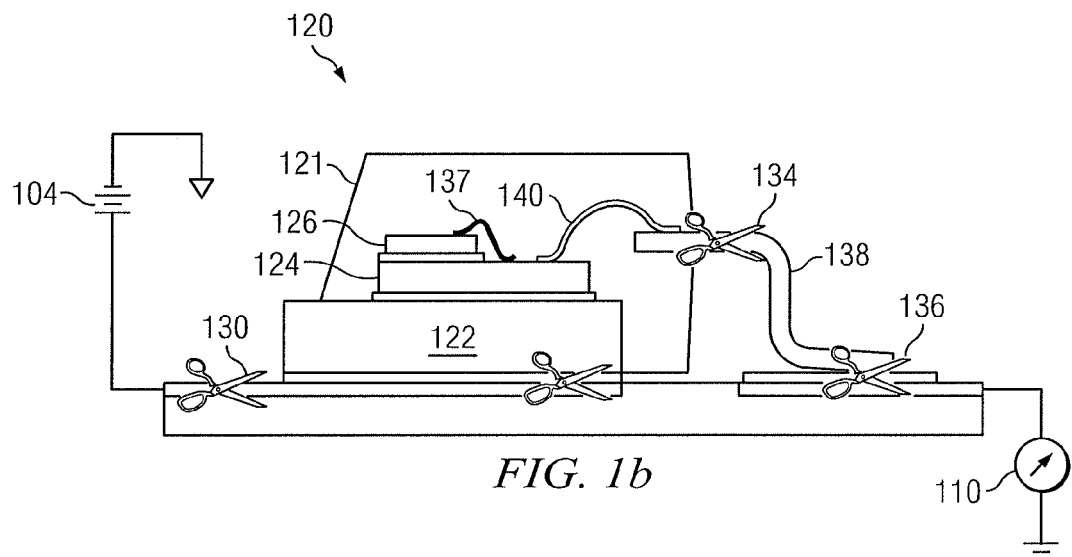

FIG. 1b is a diagram of an embodiment system 120 that shows various places in which an embodiment thermally expandable material can be used to sever the electrical connectivity of packaged circuit 121. Here, packaged circuit 121 has MOSFET chip 124 disposed on conductive substrate 122. Control integrated circuit 126 is disposed on MOSFET chip 124. The drain of MOSFET 124 is electrically connected to conductive substrate 122, and the source of MOSFET chip 124 is coupled to circuit board 120 via bond wire 140 and pin 138. Control chip 126 has bond wire 137 coupled to the gate of MOSFET chip 124.

In one embodiment the connection to battery 104 may be severed at point 130 or at point 132. In further embodiments the connection between board 120 and 10 138 may be severed at point 136. In a further embodiment, the connection to pin 138 may be severed itself at point 134. It should be appreciated that the embodiment illustrated in FIG. 1b is just one example embodiment. In alternative embodiments of the present invention other portions of the system may be configured to provide other points of electrical disconnection.

Figure 2A:
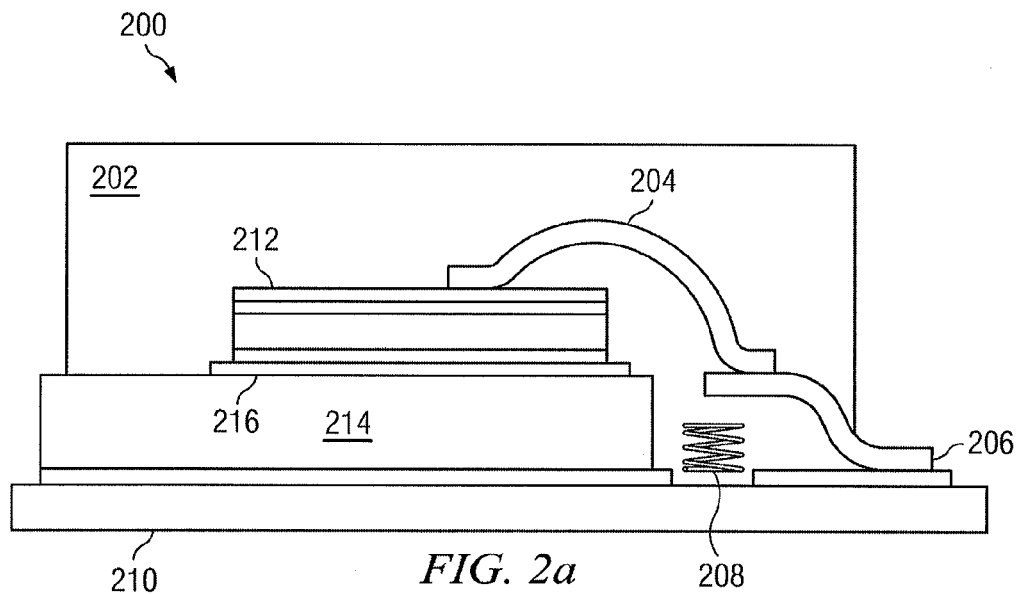
FIGS. 2a-b illustrate cross-sections of embodiment packages.

FIG. 2a illustrates a cross-section of an embodiment package 200 under normal operating conditions. Package 200 has integrated circuit 212 mounted on a lead frame 214 using die attach 216. The chip is bonded with wire bond 204 attached to pin 206. Encapsulation material 202 surrounds integrated circuit 212, lead frame 214, wire bond 204 and pin 206. In an embodiment, integrated circuit 212 may be a power transistor such as a power MOSFET transistor. In some embodiments, integrated circuit 212 may be a vertical power MOSFET device such as a Laterally Diffused Metal-Oxide Semiconductor (LDMOS) device having a drain coupled to the backside of integrated circuit 212. In such an embodiment the drain connection is made through lead frame 214 to a conductive trace on board 210. Die attach 216 may be a conductive thermal die attach using, but not limited to soft solder using high lead or lead free compositions, diffusion soldering, and epoxy die attach paste. Encapsulating material 212 may be an encapsulant such as, but not limited to an epoxy molding compound. It should be appreciated that the type of integrated circuit used for integrated circuit 212, the die attach 216 and the encapsulating material 212 represent just one example of many possible embodiments. In alternative embodiments of the present invention other integrated circuit types, die attach materials, and encapsulating materials may be used.

In an embodiment, thermally expandable and/or deformable material 208 is disposed within a cavity of package 200 circuit board 210. In FIG. 2a, thermally deformable material 208 is represented as a compressed spring for illustration purposes. Thermally deformable material 208 may be implemented using a bimetallic strip, a thermally sensitive polymer, or other thermally expandable and/or deformable material.

Figure 2B:
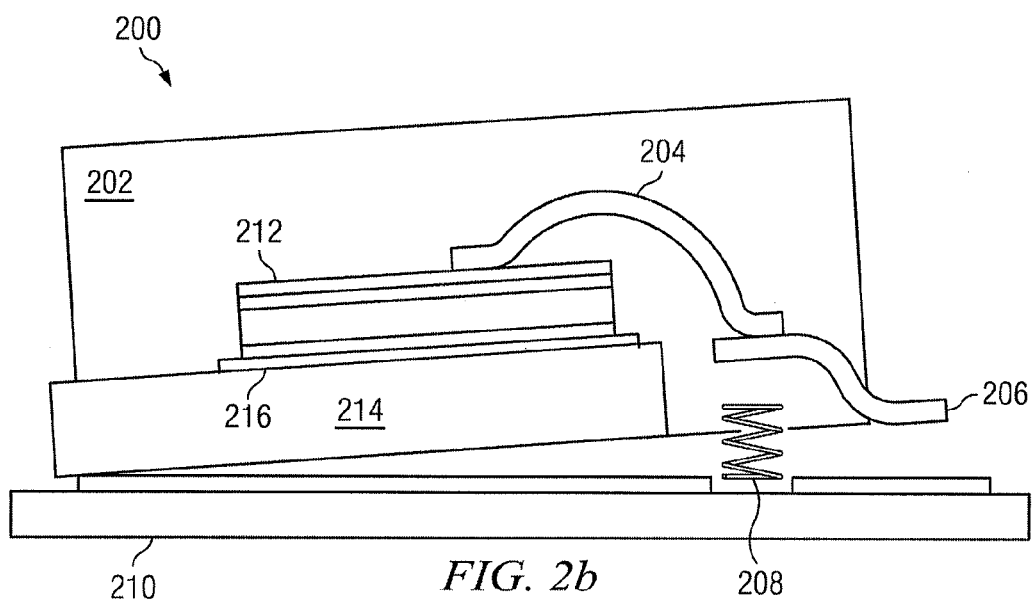

In an embodiment, under a high temperature short-circuit condition, integrated circuit 212 heats up package 200 and activates thermally deformable material 208. When this happens, thermally deformable material 208 pushes package 200 off board 210, as illustrated in FIG. 2b. In one embodiment, thermally deformable material 208 is configured to deform at greater than approximately 260° C., as mentioned above. In some embodiments the temperature at which material 208 expands or deforms is above the melt point of solder used to couple pin 206 to circuit board 208. It should be appreciated that in alternative embodiments deformable material 208 may be configured to deform at temperatures that are greater than or less than 260° C., and may vary according to the particular embodiment and its specifications.

Figure 3A:
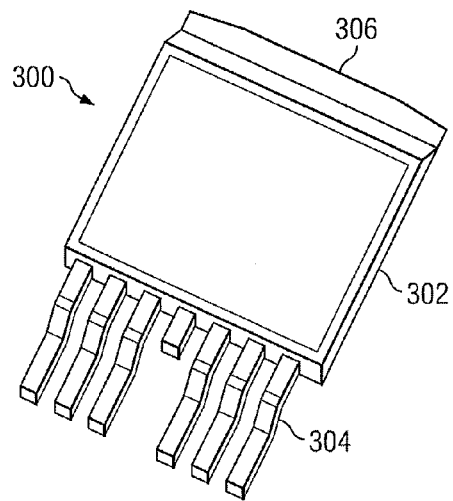
FIG. 3a-d illustrate an embodiment TO 263-7 package.
Figure 3B:
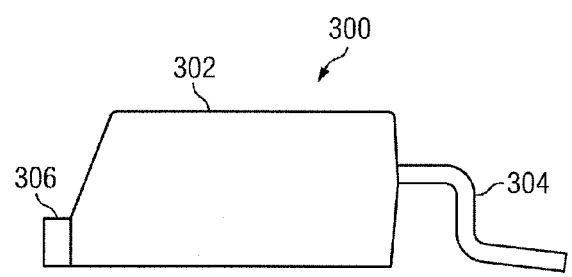
Figure 3C:
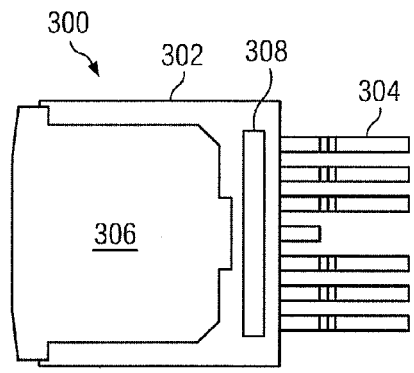
Figure 3D:
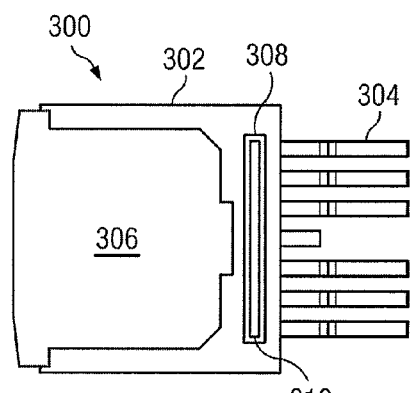

FIGS. 3a-d illustrate an embodiment TO 263-7 package, such as those used to house power transistors. FIG. 3a illustrates a top view of embodiment package 300, which has metal substrate/leadframe 306, pins 304 and encapsulant 302. FIG. 3b illustrates a side view, and FIGS. 3c and 3d illustrate bottom views. In FIG. 3c package 300 is shown having cavity 308 disposed within encapsulant 302. FIG. 3d illustrates bimetallic strip 310 disposed within cavity 308. It should be appreciated that in alternative embodiments of the present invention, bimetallic strip 310 may be mounted and/or installed within package 300 using other mounting methods besides using cavity 308 as described below. It should be further appreciated that the shape of cavity 308 may be different depending on the particular application and its specifications.

Figure 4A:
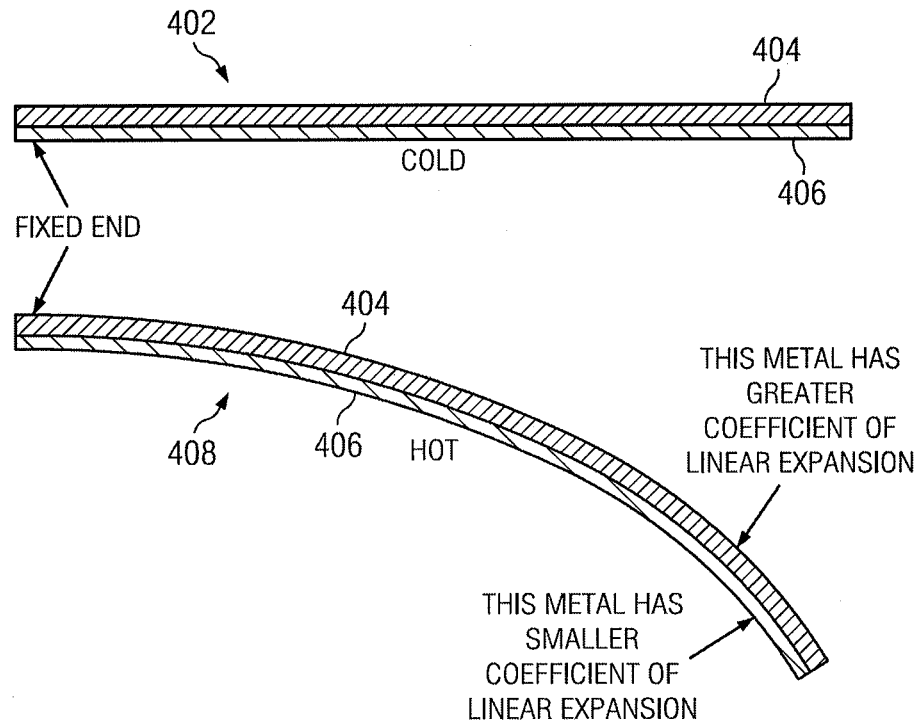
FIG. 4a-b illustrates an embodiment multi-layer strips.

FIG. 4a illustrates a side view of a bimetallic strip in both a cold condition 402 and a hot condition 408. Bimetallic strip has a first layer 404 it adhered to a second layer 406. In an embodiment first layer 404 has a greater coefficient of linear expansion then second layer 406. In one embodiment, when the bimetallic strip 402 is cold, this strip is planar. When the strip heats up, however, the strip bends in the direction of second layer 406 that has the smaller coefficient of linear expansion. In some embodiments, one and of the bimetallic strip is fixed within cavity 208. Alternatively, the bimetallic strip may be affixed in a different manner, for examples, in the further embodiments described below. Layer 404 with the greater coefficient of linear expansion may be a layer of copper, while layer 406 with the smaller coefficient of linear expansion may be a layer of iron in some embodiments. Alternatively, layers 404 and 406 may comprise, for example, Ni, Fe—Ni—Mn, or Fe—Ni—Cr on layer 404 and Fe—Ni on layer 406. In some embodiments, these materials are configured to deform at temperatures less than 400° C., for example, between about 280° C. and about 350° C. Other combinations of metals sensitive to the same and different temperature ranged may be used depending on the particular application and its specifications.

In an embodiment, the thicknesses and types of materials are chosen to affect a deformation at a particular temperature. In one embodiment, the deforming temperature is set by the combination of materials used on the thermally expandable material. In some embodiments, a locking mechanism that unlocks at a particular temperature may be used to facilitate a faster expansion when the material reaches the triggering temperature. In some embodiments, this locking mechanism may be integral to the design of the particular component.

Figure 4B:
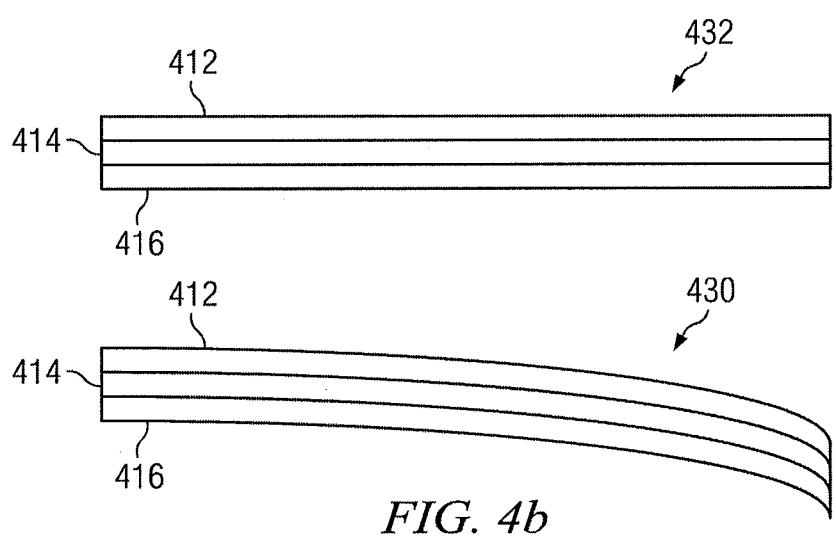

FIG. 4b illustrates a hot state 430 and eight cold state 432 of an embodiment multilayer metallic strip. In one embodiment layer 412 has a greater coefficient of linear expansion then layer 414. In addition, the multi-layer metallic strip also has layer 416 which is predisposed to be deformed at low temperatures as well as at high temperatures. In embodiments that utilize locking mechanisms, using a layer of metal that is predisposed to be deformed a low temperatures can be used to provide irreversible action to prevent the electronic component from going back to its original position if the temperature falls down below the triggering temperature. In some embodiments of the present invention this irreversible action prevents a short circuit from occurring again once the component has cooled down.

FIGS. 5a-d illustrate component 500 according to another embodiment of the present invention. Component 500 includes multilayer thermally sensitive metallic strip 502 disposed within a cavity at the underside of component 500. In some embodiments spring type layer 506 is disposed over at least a portion of multilayer thermally sensitive metallic strip 502. Clip 504 keeps metallic strip 502 in a compact loop prior to its being thermally triggered. When metallic strip 502 reaches its trigger temperature, clip 504 releases the ends of metallic strip 502, thereby causing component 502 snap upwards from the circuit board on which component 500 is mounted. Embodiments that use spring-type layer 506 and/or clip 504 employee a thermally irreversible process that prevents component 500 from achieving its initial physical position, thereby ensuring that a short circuit is not reestablished after the component cools down.

Figure 5A:
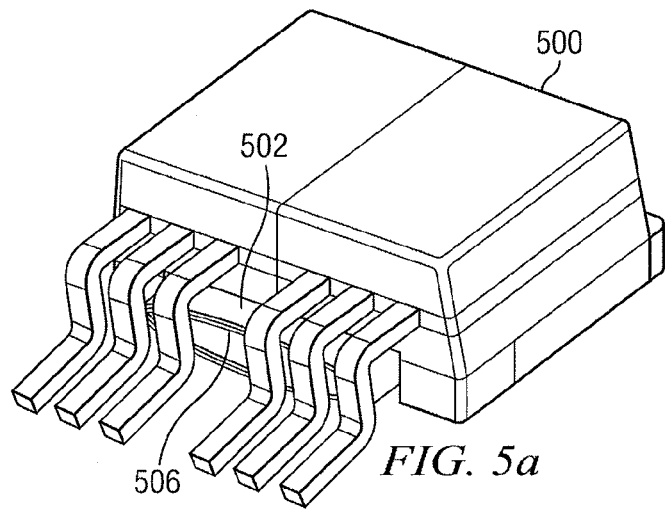
FIGS. 5a-5e illustrate a further embodiment package.
Figure 5B:
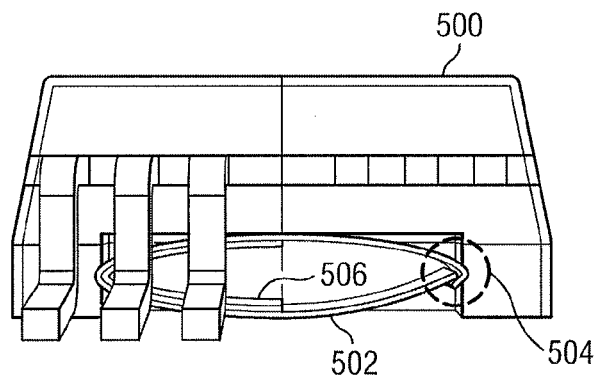
Figure 5C:
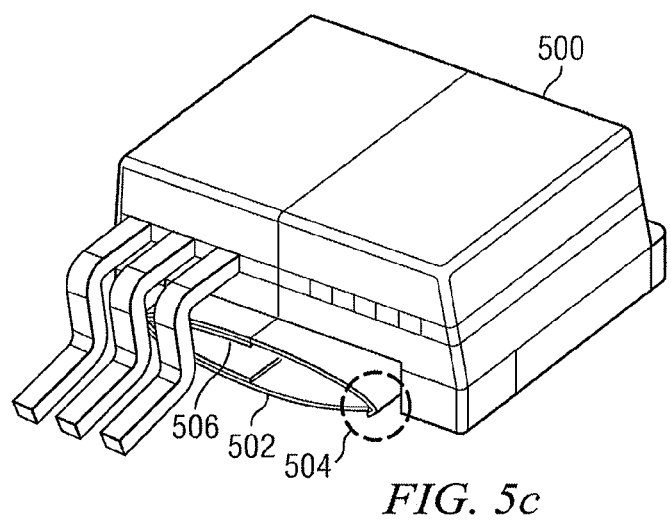
Figure 5D:
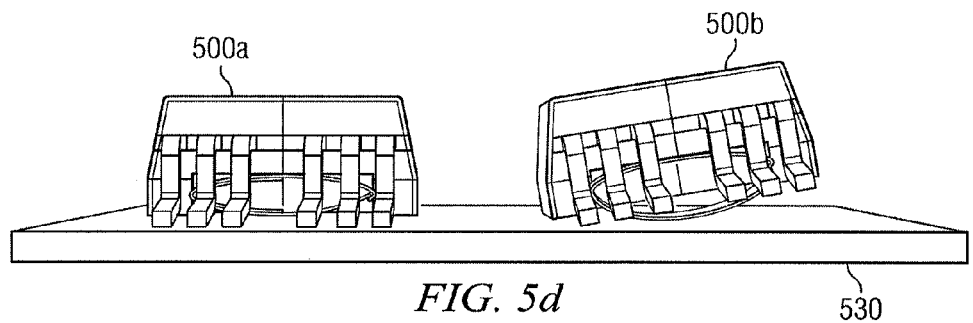
Figure 5E:
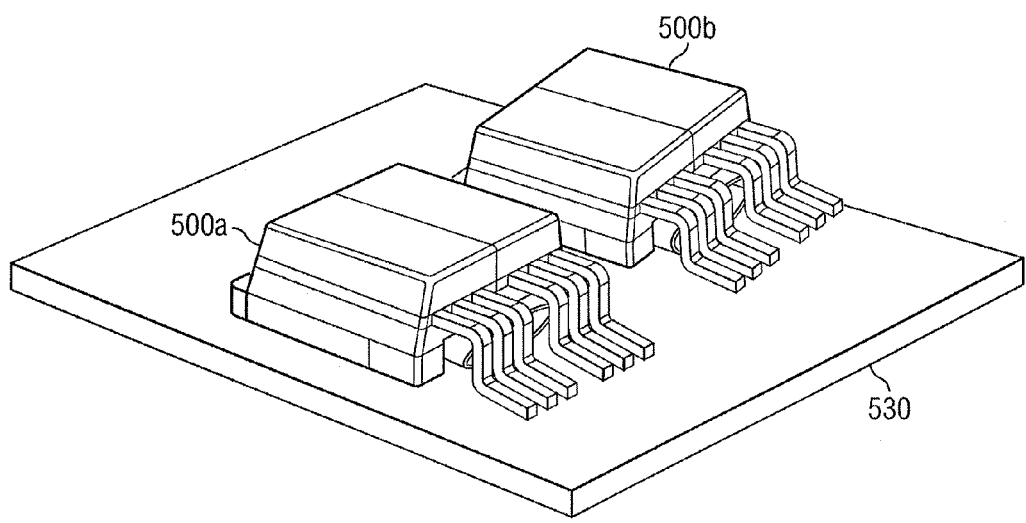

FIGS. 5d and 5e illustrate component 500 disposed on circuit board 530 in installed/functioning state 500a prior to a thermal event and in tripped state 500b subsequent to a thermal event.

Figure 6A:
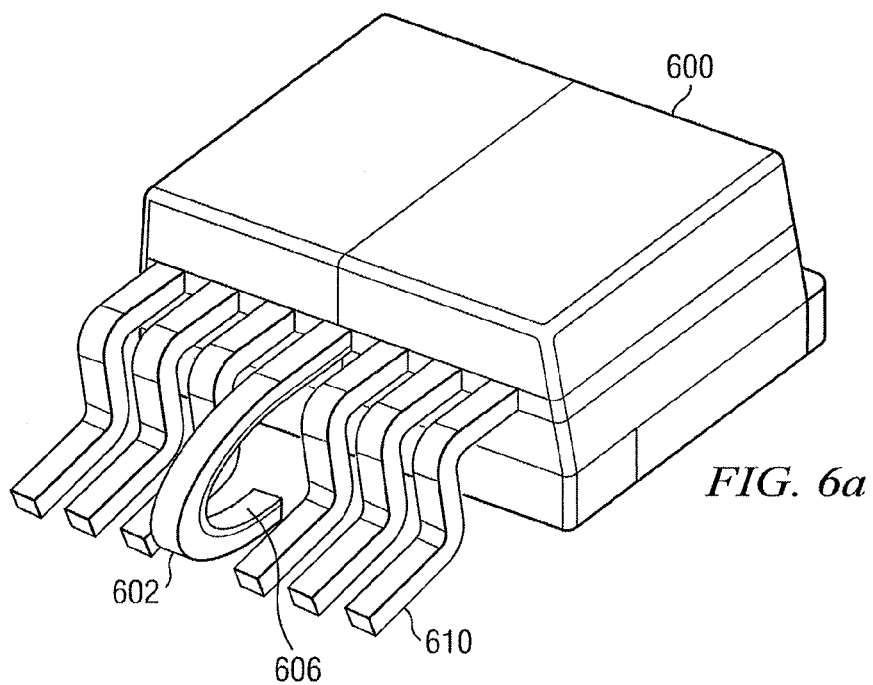
FIGS. 6a-c illustrate a package according to an alternative embodiment.
Figure 6B:
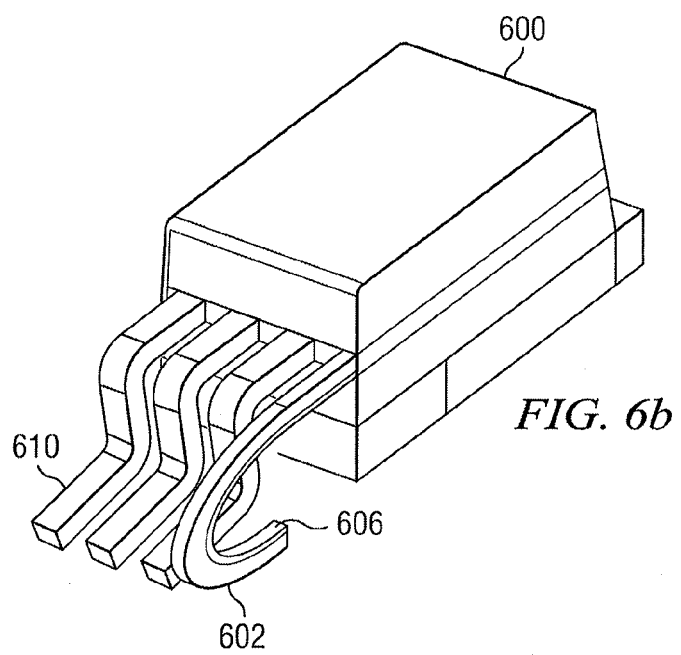
Figure 6C:
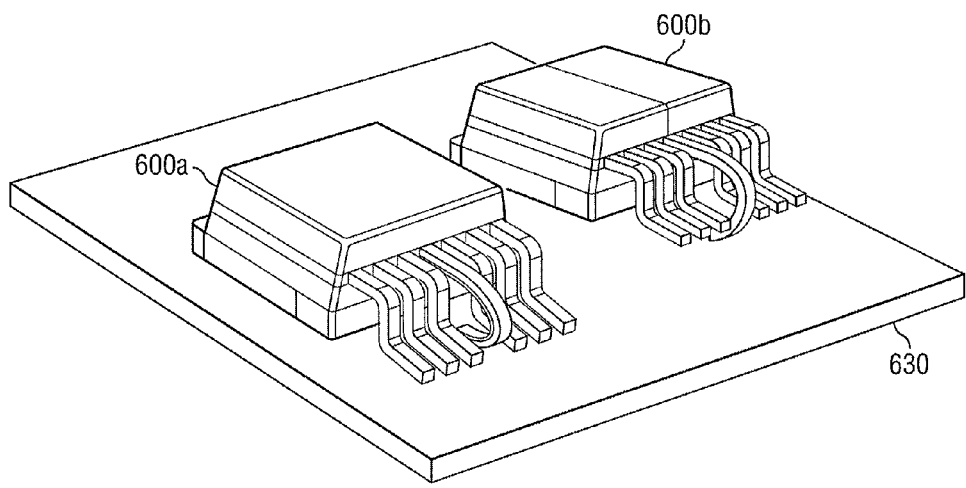

FIGS. 6a-c illustrate component 600 according to a further embodiment. Component 600 includes multilayer thermally sensitive metallic strip 602 extending from a surface of the component and looping downward toward the base of component 600 alongside pins 610. In some embodiments spring type layer 606 is disposed over at least a portion of multilayer thermally sensitive metallic strip 602 to provide a thermally irreversible response to reaching the trigger temperature. In an embodiment, when multilayer thermally sensitive metallic strip 602 reaches its triggering temperature, the strip expands and pushes pins 610 up from the surface of the circuit board on which component 600 is disposed.

FIG. 6c illustrates component 600 disposed on circuit board 630 in installed/functioning state 600a prior to a thermal event and in tripped state 600b subsequent to a thermal event.

Figure 7A:
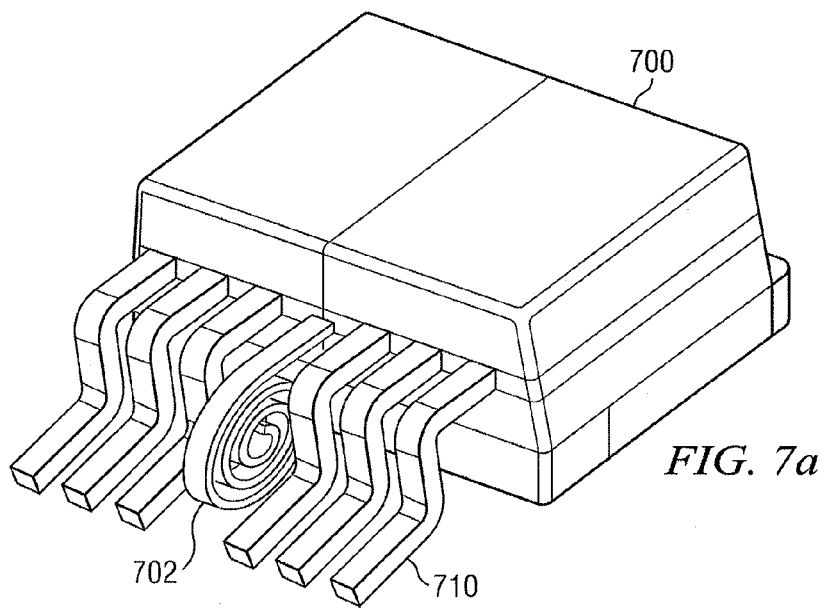
FIGS. 7a-c illustrate a package according to a further embodiment.
Figure 7B:
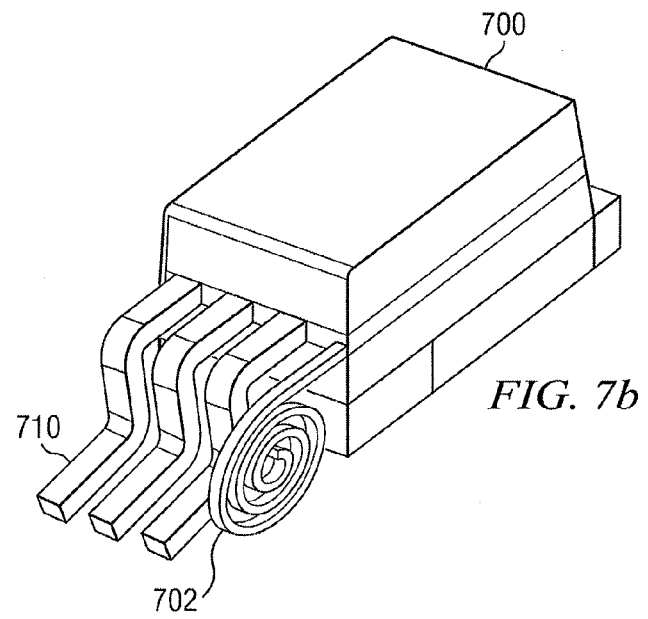
Figure 7C:
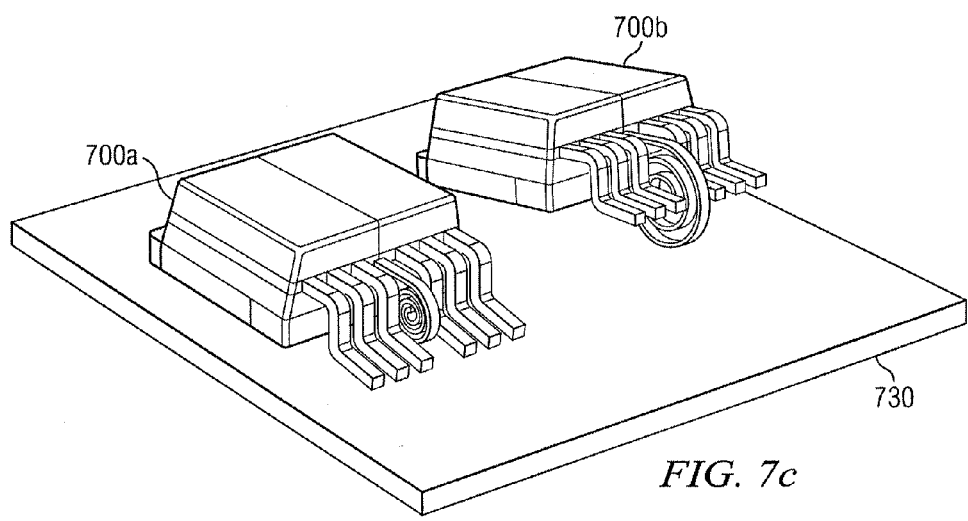

FIGS. 7a-c illustrate component 700 according to another embodiment. Component 700 includes a coiled multilayer thermally sensitive metallic strip 702 extending from a surface of the component and spiraling toward the base of component 700 alongside pins 710. In an embodiment, when multilayer thermally sensitive metallic strip 702 reaches its triggering temperature, the spiral strip expands and pushes pins 710 up from the surface of the circuit board on which component 700 is disposed. In some embodiments, the coil structure of strip 702 produces more deflection than a non-coiled strip.

FIG. 7c illustrates component 700 disposed on circuit board 730 in installed/functioning state 700a prior to a thermal event and in tripped state 700b subsequent to a thermal event.

FIGS. 8a-e illustrate component 800 according to another embodiment. Component 800 includes a thermally sensitive material 802 disposed on top of component 800. Protruding lever section 810 is attached to thermally sensitive material 802 and is disposed on a side of component 800 adjacent to pins 810. When thermally sensitive material 802 reaches its triggering temperature, the material contracts and pushes lever section 812 toward the circuit board on which component 800 is disposed. In some embodiments, clips 804 are disposed next to thermally sensitive material 802 in order to hold material 802 close to the top of component 800.

Figure 8A:
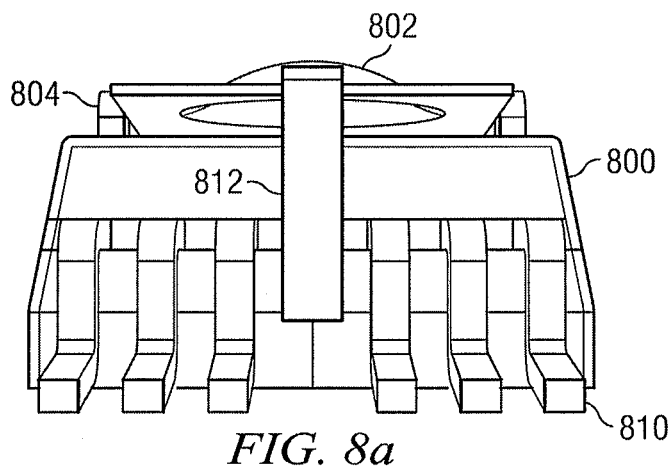
FIGS. 8a-d illustrate a package according to another further embodiment.
Figure 8B:
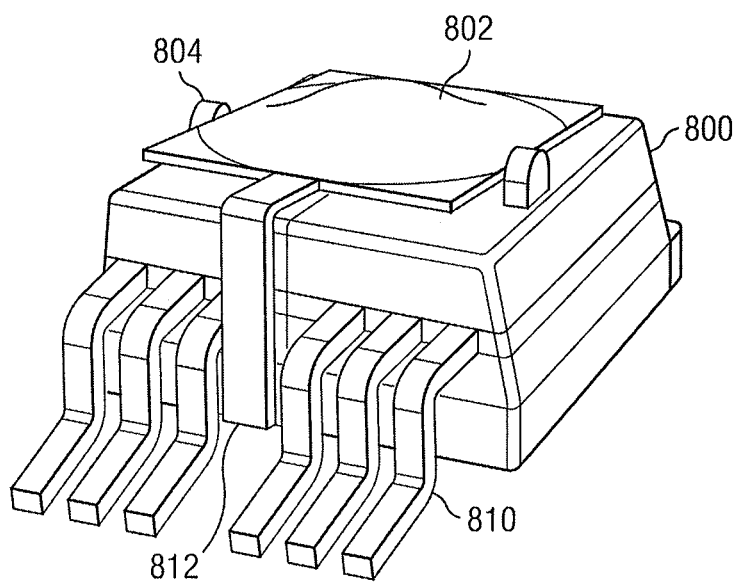
Figure 8C:
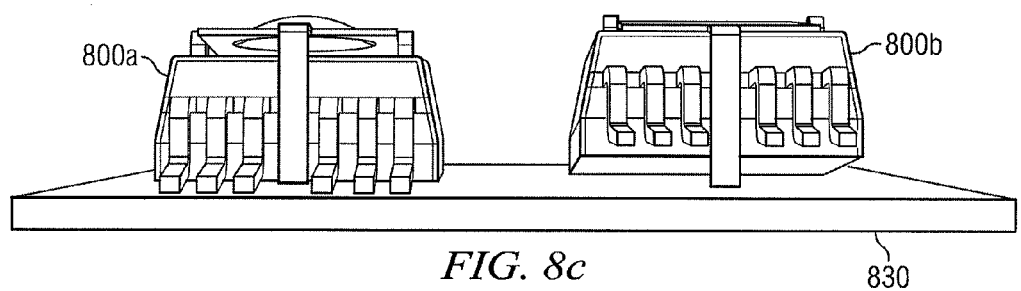
Figure 8D:
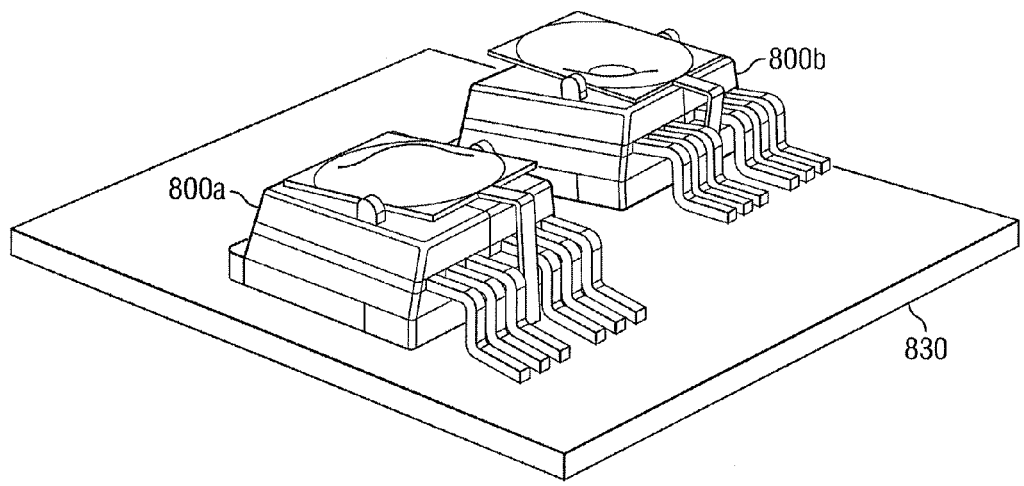

FIGS. 8d and 8e illustrate component 800 disposed on circuit board 830 in installed/functioning state 800a prior to a thermal event and in tripped state 800b subsequent to a thermal event.

FIGS. 9a-d illustrate component 900 according to a further embodiment of the present invention. Component 900 includes a thermally sensitive material 902 disposed on top of component 900 and coupled to protruding lever section 910. Pin stub 916 is electrically coupled to pin 918 via conductive bridge 914. In an embodiment, pin stub 916 is electrically connected to a circuit within package 900 and pin 918 is disconnected. Pins 910 may be normally connected package pins. In some embodiments, bridge 914 may be constructed from a solder material or copper material that is attached to pin stub 916 and pin 918 using a thermally sensitive solder. FIG. 9d illustrates one possible embodiment implementation of pin stub 916 bridge 914 and pin 918. Alternatively, other materials and configurations may be used.

During normal operation, before component 900 reaches a thermally critical temperature, pin 918 is coupled to a circuit internal to package 900 via bridge 914 and pin stub 916. When package 900 reaches a thermal threshold temperature. Thermal material 902 contracts and pushes lever 912 up against bridge 914. Because component 914 is hot, in a solder used to it here pins 910 and pin 918 to the circuit board is liquefied as well as solder used to adhere bridge 914 to pin stub 916 and pin 918. Lever 912 overcomes the surface tension/wetting force of the solder and pushes bridge 914 away from pin stub 916 and pin 918, thereby disconnecting pin 918 from the circuit internal to package 900.

Figure 10:
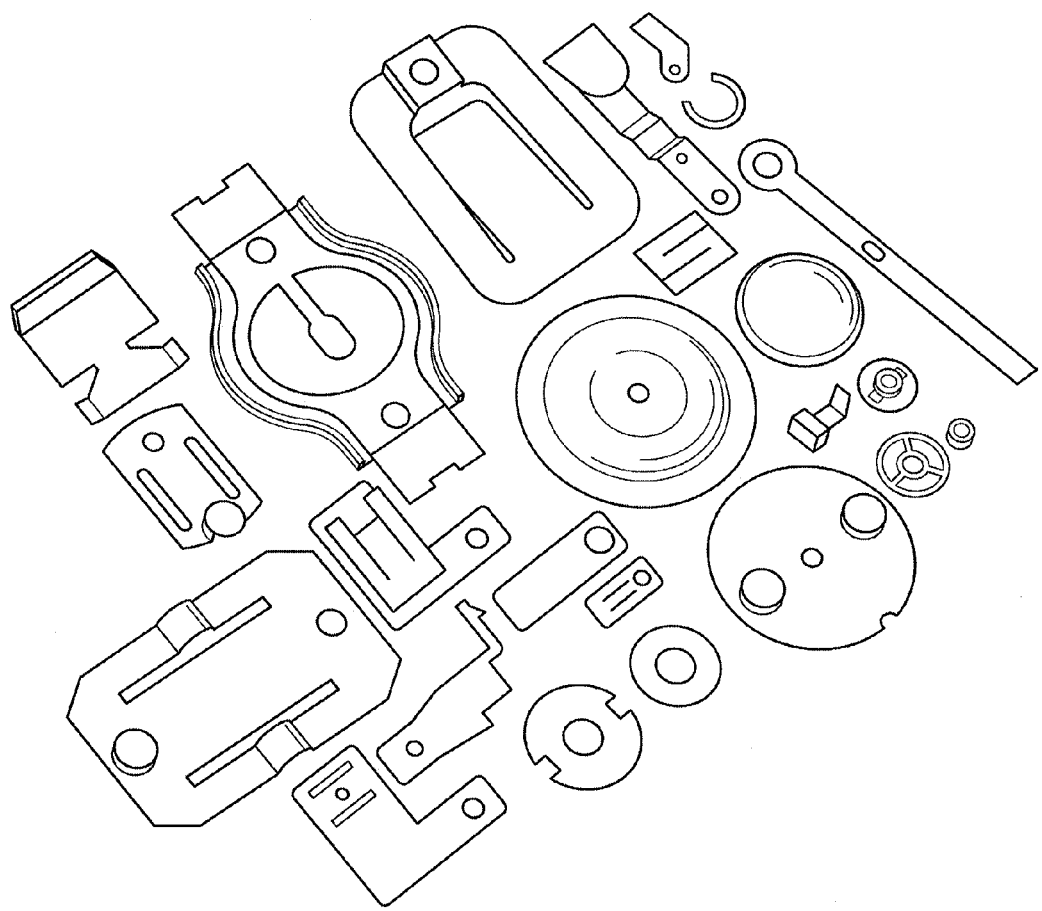
FIG. 10 illustrates various bimetallic strips according to alternative embodiments.

In alternative embodiments of the present invention, other types of thermally deforming or expandable materials may be used instead of a bimetallic strip, for example, a thermally expendable polymer. Furthermore, as shown in FIG. 10, other shapes of thermally deformable and/or expandable materials may also be used.

In accordance with an embodiment, a semiconductor package includes a first surface configured to be mounted on a circuit board, and a region of thermally expandable material configured to push the first surface of the semiconductor package away from the circuit board when a temperature of the thermally expandable material exceeds a first temperature. In one embodiment, this first temperature may be about 260° C. Alternatively, other temperatures greater or less than this may be used. In an embodiment, the region of thermally expandable material includes a multilayer metallic strip.

In some embodiments of the present invention, the multilayer metallic strip includes an inner surface having a first coefficient of linear expansion and an outer surface having a second coefficient of linear expansion. In an embodiment, the inner surface is opposite the outer surface, the inner surface is disposed on the semiconductor package facing the first surface of the semiconductor package, and the first coefficient of linear expansion is greater than the second coefficient of linear expansion. The inner surface may include copper and the outer surface. In an embodiment, the semiconductor package may also include a spring layer disposed on at least a portion of the multilayer metallic strip.

In an embodiment, the region of thermally expandable material is disposed within the first surface. In some embodiments, the semiconductor package includes a cavity disposed within the first surface, and the thermally expandable material is disposed within the cavity. The semiconductor package may further include a plurality of surface mount leads, such that the cavity is disposed adjacent to the plurality of surface mount leads.

In some embodiments, the thermally expandable material includes a thermally expandable polymer. The semiconductor package may further include a semiconductor power transistor device. Furthermore, the semiconductor package may also include a single row of surface mount contacts disposed only on a first edge of the semiconductor package, and the region of thermally expandable material is disposed adjacent to the single row of surface mount contacts. The thermally expandable material may be configured to push the surface mount contact off of a plane of the circuit board when the thermally expandable material exceeds the first temperature. In some embodiments, the thermally expandable material may include a bimetallic strip disposed within a channel disposed in the first surface of the semiconductor package. In some embodiments, the bimetallic strip includes a first end and a second end, with the first and is fixedly attached to a first end of the channel The thermally expandable material may be configured to undergo an irreversible physical deformation when the thermally expandable material exceeds the first temperature. In some embodiments, the thermally expandable material includes a clip configured to be released when the thermally expandable material exceeds the first temperature.

In accordance with a further embodiment, the electronic system includes a circuit board and a semiconductor package disposed on the circuit board. The semiconductor package may include a first surface, and a region of thermally expandable material disposed within the first surface. The region of thermally expandable material may be configured to push the first surface of the semiconductor package away from the circuit board when a temperature of the thermally expandable material exceeds a first temperature. In one embodiment, this first temperature may be about 260° C. Alternatively, other temperatures greater or less than this may be used.

In some embodiments the region of thermally expandable material is a bimetallic strip that includes an inner surface and an outer surface. In an embodiment, the inner surface has a first coefficient of linear expansion and the outer surface has a second coefficient of linear expansion. The inner surface maybe opposite the outer surface and the inner surface may be disposed on the semiconductor package facing the first surface of the semiconductor package. Furthermore, the first coefficient of linear expansion is greater than the second coefficient of linear expansion.

In an embodiment, the semiconductor package includes a row of contacts configured to be coupled to the circuit board and the region of thermally expandable material is disposed in a cavity adjacent to the row of contacts. The thermally expandable material may be configured to push the row of contacts off a plane of the circuit board when the thermally expandable material exceeds the first temperature. In some embodiments, the semiconductor package may include a power semiconductor device.

In accordance with another embodiment of the present invention, a method of providing thermal protection to a semiconductor device includes providing a semiconductor package mounted on the circuit board. The semiconductor package includes a contact coupled to the circuit board in the thermally deformable material coupled to the semiconductor package adjacent to the contact. The method also includes decoupling the contact from the circuit board via thermal expansion of the thermally deformable material when the thermally deformable material exceeds a first temperature. In one embodiment, this first temperature may be about 260° C. Alternatively, other temperatures greater or less than this may be used.

In an embodiment, decoupling the contact includes deforming a bimetallic strip such that the bimetallic strip pushes the mountable surface away from the circuit board when the thermally deformable material exceeds the first temperature. In some embodiments, decoupling the contact from the circuit board includes melting solder that coupled the contact to the circuit board to allow the bimetallic strip to push the mountable surface away from the circuit board. In an embodiment the solder has a melting point of less than the first temperature.

Advantages of some embodiments include the ability to have a high temperature trip point integrated into the package of a power transistor without the need for additional components, thereby reducing the component costs for the customer and/or manufacturer as well as making more board space available for other components. A further advantage of some embodiments includes lowered testing costs in embodiments where no additional testing of the trip mechanism is needed. A further advantage of some embodiments includes lower switch resistance because no additional series resistance is added to the current path. Some embodiments are further suitable for fast switching applications.

Although the invention has been shown and described primarily in connection with specific exemplary embodiments, it should be understood by those skilled in the art that diverse changes in the configuration and the details thereof can be made without departing from the essence and scope of the invention as defined by the claims below. The scope of the invention is therefore determined by the appended claims, and the intention is for all alterations that lie within the range of the meaning and the range of equivalence of the claims to be encompassed by the claims.

What is claimed is:

1. A semiconductor package comprising:
   a first surface configured to be mounted on a circuit board; and
   a region of thermally expandable material configured to push the first surface of the semiconductor package away from the circuit board when a temperature of the thermally expandable material exceeds a first temperature, wherein the thermally expandable material is configured to undergo an irreversible physical deformation when the thermally expandable material exceeds the first temperature.

2. The semiconductor package of claim 1, wherein the thermally expandable material comprises a thermally expandable polymer.

3. The semiconductor package of claim 1, wherein the semiconductor package further comprises a semiconductor power transistor device.

4. A semiconductor package comprising:
   a first surface configured to be mounted on a circuit board; and
   a region of thermally expandable material configured to push the first surface of the semiconductor package away from the circuit board when a temperature of the thermally expandable material exceeds a first temperature, wherein the region of thermally expandable material comprises a multi-layer metallic strip, wherein the multi-layer metallic strip comprises:
   an inner surface having a first coefficient of linear expansion; and
   an outer surface having a second coefficient of linear expansion, wherein
   the inner surface is opposite the outer surface,
   the inner surface is disposed on the semiconductor package facing the first surface of the semiconductor package, and
   the first coefficient of linear expansion is greater than the second coefficient of linear expansion.

5. The semiconductor package of claim 4, wherein the inner surface comprises copper and the outer surface comprises iron.

6. The semiconductor package of claim 4, further comprising a spring layer disposed on at least a portion of the multi-layer metallic strip.

7. A semiconductor package comprising:
   a first surface configured to be mounted on a circuit board; and
   a region of thermally expandable material configured to push the first surface of the semiconductor package away from the circuit board when a temperature of the thermally expandable material exceeds a first temperature, wherein
   the region of thermally expandable material is disposed within the first surface, and
   the semiconductor package comprises a cavity disposed within the first surface, and the thermally expandable material is disposed within the cavity.

8. The semiconductor package of claim 7, wherein:
   the semiconductor package further comprises a plurality of surface mount leads; and
   the cavity is disposed adjacent to the plurality of surface mount leads.

9. A semiconductor package comprising:
   a first surface configured to be mounted on a circuit board; and
   a region of thermally expandable material configured to push the first surface of the semiconductor package away from the circuit board when a temperature of the thermally expandable material exceeds a first temperature, wherein the semiconductor package further comprises
   a single row of surface mount contacts disposed only on a first edge of the semiconductor package, and
   the region of thermally expandable material is disposed adjacent to the single row of surface mount contacts, wherein the thermally expandable material is configured to push the surface mount contact off of a plane of the circuit board when the thermally expandable material exceeds the first temperature.

10. The semiconductor package of claim 9, wherein the thermally expandable material comprises a bimetallic strip disposed within a channel disposed in the first surface of the semiconductor package.

11. The semiconductor package of claim 10, wherein the bimetallic strip comprises a first end and a second end, the first end being fixedly attached to a first end of the channel.

12. A semiconductor package comprising:
   a first surface configured to be mounted on a circuit board; and
   a region of thermally expandable material configured to push the first surface of the semiconductor package away from the circuit board when a temperature of the thermally expandable material exceeds a first temperature, wherein the thermally expandable material comprises a clip configured to be released when the thermally expandable material exceeds the first temperature.

13. An electronic system comprising:
   a circuit board; and
   a semiconductor package disposed on the circuit board, the semiconductor package comprising a first surface, and a region of thermally expandable material disposed within the first surface, the region of thermally expandable material configured to push the first surface of the semiconductor package away from the circuit board when a temperature of the thermally expandable material exceeds a first temperature, wherein the region of thermally expandable material is a bimetallic strip comprising an inner surface having a first coefficient of linear expansion; and an outer surface having a second coefficient of linear expansion, wherein the inner surface is opposite the outer surface, the inner surface is disposed on the semiconductor package facing the first surface of the semiconductor package, and the first coefficient of linear expansion is greater than the second coefficient of linear expansion.

14. The electronic system of claim 13, wherein the semiconductor package comprises a power semiconductor device.

15. An electronic system comprising:

a circuit board; and a semiconductor package disposed on the circuit board, the semiconductor package comprising a first surface, and a region of thermally expandable material disposed within the first surface, the region of thermally expandable material configured to push the first surface of the semiconductor package away from the circuit board when a temperature of the thermally expandable material exceeds a first temperature, wherein the semiconductor package comprises a row of contacts configured to be coupled to the circuit board, and the region of thermally expandable material is disposed in a cavity adjacent to the row of contacts.

16. The electronic system of claim 15, wherein the thermally expandable material is configured to push the row of contacts off a plane of the circuit board when the thermally expandable material exceeds the first temperature.

17. A method of providing thermal protection to a semiconductor device, the method comprising:

providing a semiconductor package mounted on a circuit board, the semiconductor package comprising a contact coupled to the circuit board, and a thermally deformable material coupled to the semiconductor package adjacent to the contact; and decoupling the contact from the circuit board via thermal expansion of the thermally deformable material when the thermally deformable material exceeds a first temperature, wherein decoupling the contact comprises deforming a bimetallic strip such that the bimetallic strip pushes a mountable surface away from the circuit board when the thermally deformable material exceeds the first temperature, and decoupling the contact from the circuit board comprises melting solder that coupled the contact to the circuit board to allow the bimetallic strip to push the mountable surface away from the circuit board, wherein the solder has a melting point of less than the first temperature.

18. The method of claim 17, wherein the first temperature is about 260° C.

* * * * *